United States Patent [19]

Holzmann et al.

[11] 4,295,126

[45] Oct. 13, 1981

[54] MOS-BINARY-TO-DECIMAL CODE CONVERTER

[75] Inventors: Dieter Holzmann, Freiburg; Friedrich Schmidtpott, Hartheim, both of Fed. Rep. of Germany

[73] Assignee: ITT Industries, Inc., New York, N.Y.

[21] Appl. No.: 193,205

[22] Filed: Oct. 2, 1980

[51] Int. Cl.³ ............................................. G06F 5/02
[52] U.S. Cl. ........................................... 340/347 DD
[58] Field of Search ................ 340/347 DD; 235/310; 365/230; 307/DIG. 5

[56] References Cited

U.S. PATENT DOCUMENTS

| | | | |
|---|---|---|---|
| 2,769,968 | 11/1956 | Schultheis | 340/347 DD |
| 3,381,270 | 4/1968 | Huffman | 340/347 DD |
| 3,594,730 | 7/1971 | Toy | 340/347 DD |
| 3,761,915 | 9/1973 | Henegar | 340/347 DD |
| 4,032,764 | 6/1977 | Savage | 340/347 DD |
| 4,104,735 | 8/1978 | Hofmann | 365/230 |

Primary Examiner—Charles D. Miller
Attorney, Agent, or Firm—John T. O'Halloran; Peter C. Van Der Sluys

[57] ABSTRACT

A binary-to-decimal code converter consists of matrix-like arranged MOS transistors connected in series and parallel to each other in order to enable the optimum space arrangement on the chip.

1 Claim, 2 Drawing Figures

| | DB=<br>D1...D32 | B1.....B32 A | B | C | D | E | DE 1 | 2 | 3 | 4 | 5 | 6 | 7 | 8 | 9 | 0 | DZ 1 | 2 | 3 |
|---|---|---|---|---|---|---|---|---|---|---|---|---|---|---|---|---|---|---|---|
| ↑ | 1 | H | H | H | H | H | H | | | | | | | | | | | | |
| | 2 | L | H | H | H | H | | H | | | | | | | | | | | |
| | 3 | H | L | H | H | H | | | H | | | | | | | | | | |
| | 4 | L | L | H | H | H | | | | H | | | | | | | | | |
| DK1 | 5 | H | H | L | H | H | | | | | H | | | | | | | | |
| | 6 | L | H | L | H | H | | | | | | H | | | | | | | |
| | 7 | H | L | L | H | H | | | | | | | H | | | | | | |
| | 8 | L | L | L | H | H | | | | | | | | H | | | | | |
| | 9 | H | H | H | L | H | | | | | | | | | H | | | | |
| ↓ | 10 | L | H | H | L | H | | | | | | | | | | H | H | | |
| ↑ | 11 | H | L | H | L | H | H | | | | | | | | | | H | | |
| | 12 | L | L | H | L | H | | H | | | | | | | | | H | | |
| | 13 | H | H | L | L | H | | | H | | | | | | | | H | | |
| | 14 | L | H | L | L | H | | | | H | | | | | | | H | | |
| DK2 | 15 | H | L | L | L | H | | | | | H | | | | | | H | | |
| | 16 | L | L | L | L | H | | | | | | H | | | | | H | | |
| | 17 | H | H | H | H | L | | | | | | | H | | | | H | | |
| | 18 | L | H | H | H | L | | | | | | | | H | | | H | | |
| | 19 | H | L | H | H | L | | | | | | | | | H | | H | | |
| ↓ | 20 | L | L | H | H | L | | | | | | | | | | H | | H | |
| ↑ | 21 | H | H | L | H | L | H | | | | | | | | | | | H | |
| | 22 | L | H | L | H | L | | H | | | | | | | | | | H | |
| | 23 | H | L | L | H | L | | | H | | | | | | | | | H | |
| | 24 | L | L | L | H | L | | | | H | | | | | | | | H | |
| DK3 | 25 | H | H | H | L | L | | | | | H | | | | | | | H | |
| | 26 | L | H | H | L | L | | | | | | H | | | | | | H | |
| | 27 | H | L | H | L | L | | | | | | | H | | | | | H | |
| | 28 | L | L | H | L | L | | | | | | | | H | | | | H | |
| | 29 | H | H | L | L | L | | | | | | | | | H | | | H | |
| ↓ | 30 | L | H | L | L | L | | | | | | | | | | H | | | H |
| DK4 | 31 | H | L | L | L | L | H | | | | | | | | | | | | H |
| ↓ | 32 | L | L | L | L | L | | H | | | | | | | | | | | H |

Fig. 2

MOS-BINARY-TO-DECIMAL CODE CONVERTER

BACKGROUND OF THE INVENTION

1. Field of the Invention

The invention relates to a MOS switching circuit for converting the code of an n-position binary number (n>3) into the code of the associated, at least two-place decimal number.

2. Description of the Prior Art

Binary-to-decimal code converters for converting a four-position binary code into a one-place decimal code are known, for example, from DE-AS No. 17 62 759. This code converter uses per decimal units digit each time one AND-Gate having four inputs to which the binary position signals or the complements thereof are to be applied accordingly. This code converter is realized as a bipolar integrated circuit with the aid of transistors arranged in parallel with one another by way of their collector-emitter paths acting upon a common emitter resistor designed as a voltage divider, to the tapping point of which there is connected an inverter transistor. This DE-AS, however, discloses nothing about the way in which the digit corresponding to the decimal tens position is obtained from the four-position binary code.

Moreover, from DE-OS No. 24 52 319 there is known a decoding circuit composed of MOS-devices, for a one-out-of-n binary code serving as a read-out circuit for corresponding memories built up in a matrix way. This arrangement contains per bit the series arrangement of three MOS transistors, with the center one and one of the two other transistors each time being arranged in parallel with one further transistor.

With regard to a code converter converting an n-position binary code into a one-out-of-$2^n$ code, one realization with the aid of the so-called ECL-technique has become known from DE-AS No. 25 34 736, hence also using a bipolar circuit technique for integrated circuits.

SUMMARY OF THE INVENTION

Against the background of this rather generalized prior art, it is the object of this invention to provide a binary-to-decimal code converter capable of being realized by employing the technique of integrated circuits consisting of insulated-gate field-effect transistors (MOS-technique), with it having to be designed in such a way from a circuit-technical point of view that there will result an optimum space-saving arrangement on the semiconductor chip, i.e. the number of employed transistors shall be as small as possible, and the arrangement on the semiconductor chip shall be as optimal as possible. Moreover, within the scope of this problem, there is also supposed to be found a possibly raster-like matrix arrangement.

DESCRIPTION OF THE DRAWINGS

FIG. 2, in the form of a table, shows the signal plan referring to the example of embodiment shown in FIG. 1.

DESCRIPTION OF THE INVENTION

Figure 1:
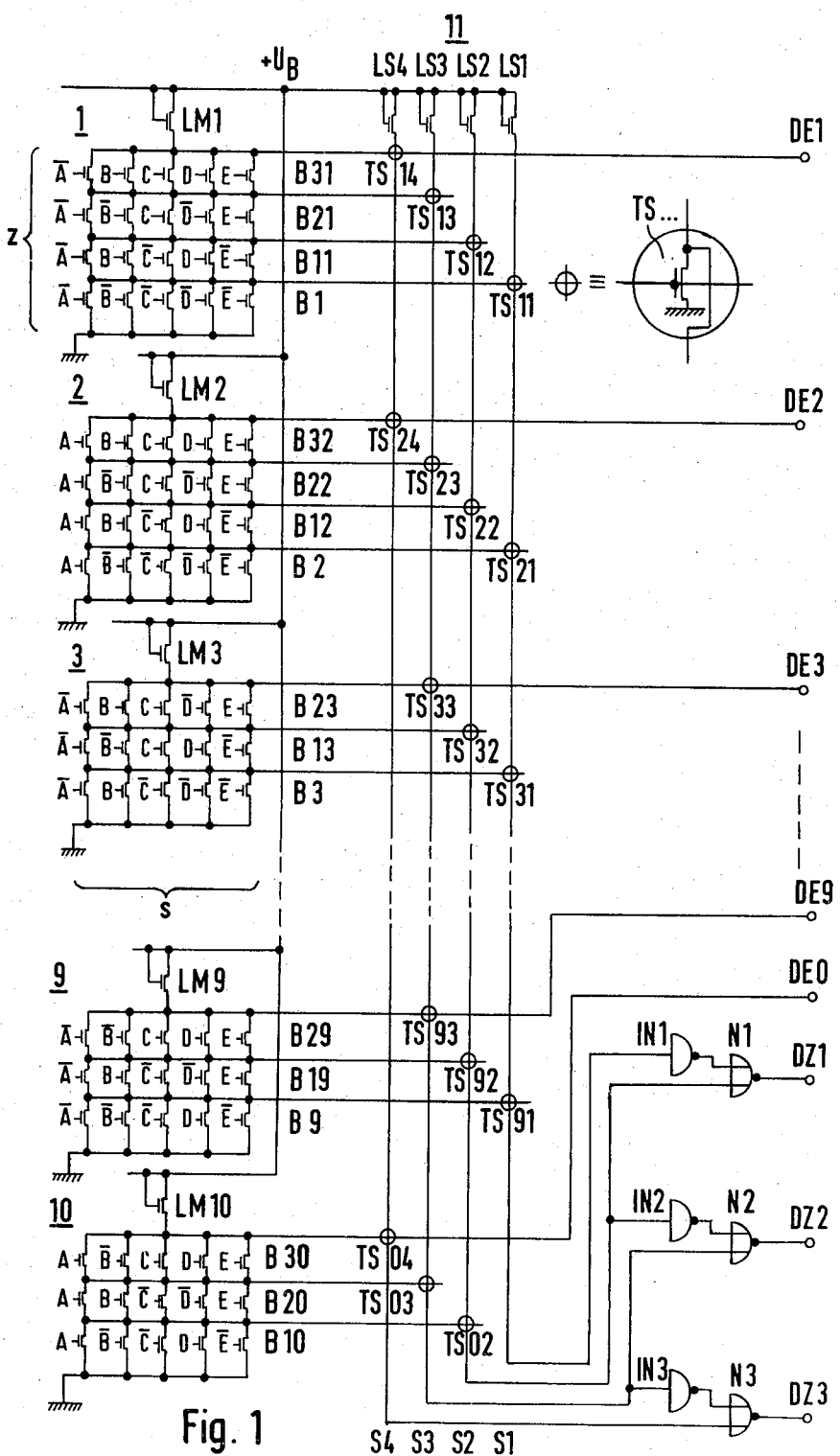
FIG. 1 shows a basic circuit diagram relating to one example of embodiment of the invention for effecting the binary-to-decimal code conversion of a five-position binary code into the corresponding decimal code.

FIG. 1, in the form of a schematic circuit diagram, shows the circuit-technical and partly also geometrical layout of an example of embodiment of the invention for the code conversion of the five-position binary numbers B1-B32 into the decimal numbers D1-D32 of the associated decimal number range DB, see also the statements made in FIG. 2. Accordingly, with respect to the example of embodiment shown in FIGS. 1 and 2, n=5 is applicable, which means to imply that there is covered the decimal number range extending from 1 to 32. Of course, the invention is in no way restricted to five-position binary numbers, and just as well also binary numbers with more than five positions may be converted into the corresponding code of the associated decimal numbers.

As may be taken from the table shown in FIG. 2, it is necessary for explaining and characterizing the invention, to divide the decimal numbers into decades, and to identify the individual positions of the binary numbers. The individual decimal decades are in such a way defined according to FIG. 2, that the first decimal decade DK1 includes the decimal numbers D1 to D10, the second decimal decade DK2 includes the decimal numbers D11 to D20, the third decimal decade DK3 includes the decimal numbers D21 to D30, and the fourth decimal decade DK4 includes the remaining decimal numbers D31, D32 of the decimal number range DB. From this there will already be recognized a certain regularity of the binary numbers, i.e. insofar as the highest corresponding decimal decade never includes ten numbers. In the invention, as will be seen from the further explanation, this property is taken into consideration in a clever way by the conception of the MOS switching circuit.

To the individual positions of the binary numbers there belong the position signals A, B, C, D, E as listed in FIG. 2 and which, in the well known way, may assume the value H corresponding to the more positive one of two binary states, or else the value L corresponding to the more negative binary state. This assignment of the H- or the L-states to the binary positions results when the example of embodiment as shown in FIG. 1, is realized by using n-channel insulated-gate field-effect transistors. When realized by using transistors of the other conductivity type, the binary states as shown in FIG. 2 are all to be inverted, i.e. an H-state is to be replaced by an L-state, and vice versa.

The table in FIG. 2 finally still shows that the respective decimal number is considered to consist of the digit of the decimal units place DE and of the digit of the decimal tens place DZ, with these definitions likewise having proved to be suitable.

The example of embodiment given in FIG. 1 shows in its left-hand half, of the ten existing ones, the five NOR matrices 1, 2, 3, 9, 10 which, in this order of sequence, are associated with the decimal digits in the units place DE1-DE0. Each of the NOR-matrices 1-10 consists of row and columnwise arranged s times z transistors wherein the number of columns s equals n, and the number of rows z, in the utmost is equal to the number d of the decimal decades DK as contained within the decimal number range DB; accordingly, in the example of embodiment, n=5 and d=4 or 3. In each of the NOR-matrices 1-10 the controlled current paths of the transistors of each row, hence of the row transistors, are arranged in parallel with one another, and those of the transistors of each column, hence of the column transistors, are arranged in series with one another, with the one end of each series arrangement being applied to the zero point of the circuit, and with the other end thereof, via the load transistor LM1–LM10 as provided per NOR-matrix 1–10, in common to all columns, being applied to the supply voltage +$U_B$.

To each row of the ten NOR-matrices 1–10 there is assigned one of the binary numbers B1–B32 in such a way that in each of the NOR-matrices 1–10 there are assembled the binary numbers having the same decimal units digit DE1–DE0, so that accordingly, in the NOR-matrix 1 there are assembled the binary numbers B1, B11, B21, B31, in the NOR-matrix 2 there are assembled the binary numbers B2, B12, B22, B32, and in the NOR-matrix 3 there are assembled the binary numbers B3, B13, B23, etc., while in the NOR-matrix 9 there are assembled the binary numbers B9, B19, B29, and in the NOR-matrix 10 there are assembled the binary numbers B10, B20, B30.

Within the individual NOR-matrices 1–10 the assignment of the associated binary numbers is made in such a way that the row applied to the zero point of the circuit, belongs to the binary number B1–B10 from the lowest decimal decade DK1, that the row which is the next higher one in direction towards the common load transistor LM1–LM10, belongs to the binary number B11–B20 from the next higher decimal decade DK2, etc., up to the row applied to the load transistor LM1–LM10, which belongs to the binary number B31, B32 from the highest decimal decade DK4. Hence, with respect to five-position binary numbers according to the example of embodiment given in FIG. 1, the NOR-matrices 1, 2 each time contain four rows and the NOR-matrices 3–10 contain three rows. In the case of six-position binary numbers, hence corresponding to the decimal number range DB from D1 to D64, accordingly, the first four NOR-matrices would have to have seven rows, and the remaining six NOR-matrices would have to have six rows. In the case of seven-position binary numbers the first eight NOR-matrices would have thirteen, and the remaining two NOR matrices would have twelve rows.

The position signals A–E of one individual binary number or the complements $\overline{A}, \overline{B}, \overline{C}, \overline{D}, \overline{E}$ of the position signals A–E are to be applied in such a way to the row transistors belonging to this particular binary number, that these transistors are all switched to the non-conducting state upon occurrence of the corresponding code.

In the example of embodiment given in FIG. 1 there are shown the binary numbers associated with the individual rows and, in addition thereto, the position signals belonging to these particular rows, in their direct or complementary, hence inverted form. Thus, for example the row B1 in the NOR-matrix 1 shows that all position signals are to be applied in inverted form, hence the signals $\overline{A}$–$\overline{E}$. In due consideration of the position signals shown in FIG. 2 with respect to the binary number B1, which all assume an H-state, it thus results that upon application of this signal to the row of the NOR-matrix 1 designated B1, all transistors of this row are switched to the non-conducting state, because n-channel transistors have the property of being switched to the non-conducting state when being controlled by an L-state signal. Analogously the same considerations apply to all other rows of the individual NOR-gates.

From the aforementioned assignment of the rows of the respective NOR-matrix to the binary numbers of the same decimal units digit, in which case the rows, by starting from the zero point of the circuit, are in such a way arranged "above each other" that to each next-higher row there is applied the binary number belonging to the next-higher decimal decade, there results the function which is essential to the invention, namely that to the output of the respective row which is identical to the end of the controlled current path of the corresponding row transistors not facing the zero point of the circuit, an H-state will appear then and only then when the associated binary number is applied to the gate electrodes of the associated row transistors. In the case of a non-applied binary number code all of the transistors of the respective NOR-matrix are switched to the conducting state, so that an L-state is apparent at the associated row outputs. If now, in the applied code, there appears the code of a corresponding row, hence e.g. the code belonging to the binary number B1, the transistors of this particular row are switched to the non-conducting state and, owing to the conducting state of the other transistors of this NOR-matrix whose series resistance is small compared to the resistance of the load transistor LM1, the aforementioned H-state will appear at the output of this particular row. Analogously the same applies when, for example, in the NOR-matrix 1, the transistors of the row belonging to the binary number B21, hence of the third row when looked at from the zero point of the circuit, are driven into the non-conducting state, because in this particular case the series resistances of the conducting transistors of the other rows are negligible, so that accordingly again an H-state will appear at the output of the blocked row.

The signals appearing at the row outputs of the NOR-matrices 1–10 according to FIG. 1, are now further processed in the multiple-NOR-gate 11. This gate comprises p columns S1–S4, with p being equal to the number d of the decimal decades DK1–DK4 as contained in the decimal number range DB of the binary numbers B1–B32, i.e. the column number p is also equal to the larger one of the two possible numbers of rows z of the NOR-matrices 1–10.

To the individual columns S1–S4 there is equidirectionally assigned one decimal decade DK1–DK4, that is, to the column S1 there is assigned the decimal decade DK1, etc. Each column consists of the transistors TS ... which are connected in parallel with their controlled current paths and arranged between the common load transistors LS1, LS2, LS3, LS4 and the zero point of the circuit. They are connected in the following manner to the row outputs of the NOR-matrices 1–10:

To the output of the rows from the first nine NOR-matrices 1–9 as associated with the first nine binary numbers B1–B9, there is applied the gate electrode of the transistors TS11–T91 included in the first column S1. To the output of the rows of all ten NOR-matrices 1–10 as associated with the following ten binary numbers B10–B19, there is applied the gate electrode of the transistors TS02–TS92 of the second column S2. Correspondingly the same also applies to the transistors TS03–TS93 of the third column, and to the transistors TS04, TS14, TS24 of the fourth column S4.

Accordingly, in greater detail, for example, the gate electrode of transistor TS11 is applied to the output of the row of the NOR-matrix 1 which is associated with the binary number B1 while for example, the gate electrode of transistor TS02 is applied to the output of the row of the NOR-matrix 10 associated with the binary number B10, or the gate electrode of transistor TS04 is applied to the output of the row of the NOR-matrix 10 belonging to the binary number B30, or else the gate electrode of transistor TS24 is applied to the output of the row of the NOR-matrix 2 as associated with the binary number B32.

Moreover, for obtaining the signal with respect to the decimal tens digits DZ1, DZ2, DZ3, the outputs of the columns S1–S4 of the multiple-NOR-gate 11 are connected as follows:

The output of the first column S1, via the first inverter IN1, is applied to the first input of the first decade-NOR-gate N1, to the second input of which there is applied the output of the second column S2. Moreover, this output, via the second inverter IN2, is applied to the first input of the second decade-NOR-gate N2, to the second input of which there is applied the output of the third column S3. This, in turn, is applied via the third inverter IN3, to the first input of the third decade-NOR-gate N3, to the second input of which there is applied the output of the fourth column S4. This way of interconnecting the individual column outputs, which is identical to the point connecting the transistors TS . . . of the respective column to the associated load transistors LS1–LS4, is continued in the aforementioned arrangements correspondingly with a position number of the binary number deviating from n=5. From this, and in the case of arrangements for n≧7, there also result the decimal-hundreds digits.

The code relating to the decimal units places DE0–DE9 is to be taken off the output of the rows of the NOR-matrices 1–10 associated with the highest decimal decade DK4 or DK3, and the code for the decimal-tens places DZ1–DZ3 is to be taken off the output of the decade-NOR-gates N1–N3. At the point connecting the respective load resistor LM1–LM10 to the corresponding transistors in the "topmost" row of the NOR-matrices 1–10 there is thus formed the signal for the decimal-units places, hence at the load resistor LM1 of the NOR-matrix 1, the signal for the decimal-units place DE1, at the load resistor LM2 of the NOR-matrix 2, the signal for the decimal-units place DE2, etc. up to the load resistor LM10 of the NOR-matrix 10 providing the signal for the decimal units place DE0.

What is claimed is:

1. An MOS switching circuit for converting the code of an n-position binary number (n>3) into the code of the associated, at least two-place decimal number with the aid of MOS-gates which are controlled by the respective binary position signals or the complement thereof, corresponding to the binary positions of the binary number, said circuit comprising: a NOR-matrix (1–10) with s times z transistors arranged in a row- and column-wise manner (s=number of columns, z=number of rows), is provided for each of the ten digits in the units place (DE1–DE0) of the decimal numbers (D1–D32), in each NOR-matrix (1–10) the controlled current paths of the transistors of each row, hence the row transistors, are arranged in parallel with one another, and the controlled current paths of the transistors of each column, hence the column transistors, are arranged in series with one another, with the one end of each series arrangement being applied to the zero point of the circuit, and with the other end thereof, via a load transistor (LM1–LM10) which is common to all columns per NOR-matrix (1–10), being applied to the supply voltage ($+U_B$), the number of columns s of the respective NOR-matrix (1–10) equals n, the number of rows z is in the utmost equal to the number (d) of the decimal decades (DK) contained in the decimal number range (DB) as represented by the n-position binary numbers (B1–B32), to each row of the ten NOR-matrices (1–10) there is assigned one of the binary numbers (B1–B32) in such a way that in each NOR-matrix the binary numbers (B1, B11, B21, B31, etc.) are combined with the same decimal units digit (DE1–DE0), i.e. in such a way that the row as applied to the zero point of the circuit belongs to the binary number (B1–B10) with this decimal units digit from the lowest decimal decade (DK1), that the row which is the next higher one in direction towards the common load transistor (LM1) belongs to the binary number (B11–B20) with the same decimal units digit from the next higher decimal decade (DK2), etc. up to the row applied to the load transistor (LM1) which belongs to the binary number (B31, B32) with the same decimal units digit from the highest decimal decade (DK4), to the gate electrodes of the row transistors in a row belonging to one individual binary number (B1–B32) there are to be applied the position signals (A, B, C, D, E) of this binary number or else the complement thereof ($\overline{A}, \overline{B}, \overline{C}, \overline{D}, \overline{E}$) so that in this way all row transistors of this particular row are switched to the non-conducting state, moreover, there is provided a multiple-NOR-gate (11) having p columns (S1–S4), with p being equal to the number (d) of the decimal decades (DK1–DK4) as contained in the decimal number range (DB) of the binary numbers (B1–B32), to each column (S1–S4) there is equidirectionally assigned one decimal decade (DK1–DK4) (S1 $\triangleq$ DK1, etc.), and this particular column consists of transistors (TS . . . ) arranged parallel in relation to one another with their controlled current paths, arranged between one common load transistor (LS1–LS4) and the zero point of the circuit, the gate electrode of respectively one transistor (TS11–TS91) of the first column (S1) is applied to the output of the rows of the first nine NOR-matrices (1–9) associated with the first nine binary numbers (B1–B9), the gate electrode of respectively one transistor (TS02–TS92) of the second column (S2) is applied to the output of the rows of the ten NOR-matrices (1–10) as associated with the following ten binary numbers (B10–B19), the gate electrode of respectively one transistor (TS03–TS93) of the third column (S3), is applied to the output of the rows of the ten NOR-matrices (1–10) associated with the ten following binary numbers (B20–B29), etc., the gate electrode of respectively one transistor (TS04–TS24) of the last column (S4) is applied to the output of the rows of the ten NOR-matrices (1–10) associated with the remaining binary numbers (B30–B32), the output of the first column (S1) is applied via a first inverter (IN1) to the first input of a first decade-NOR-gate (N1) to the second input of which there is applied the output of the second column (S2), this output is applied via a second inverter (IN2) to the first input of a second decade-NOR-gate (N2), to the second input of which there is applied the output of the third column (S3), this output is applied via a third inverter (IN3) to the first input of a third decade-NOR-gate (N3), to the second input of which there is applied the output of the fourth column (S4), etc., up to reaching the highest decimal decade, at the output of the rows of the NOR-matrices (1–10) associated with the highest decimal decade (DK4 or DK3) there is to be taken off the signal for the digits (DE0–DE9) of the decimal units position (DE), and at the output of the decade-NOR-gate (N1–N3) there is to be taken off the signal for the digits (DZ1–DZ3) of the decimal-tens position (DZ), and all of the employed transistors are of the same conductivity type (n-channel or p-channel) as well as the same control type (depletion or enhancement type).

* * * * *